US012666528B2

(12) United States Patent
Kim et al.

(10) Patent No.: US 12,666,528 B2
(45) Date of Patent: Jun. 23, 2026

(54) MULTI-CONFIGURABLE ANTENNA TUNER CIRCUIT BOARD

(71) Applicant: DELL PRODUCTS L.P., Round Rock, TX (US)

(72) Inventors: Changsoo Kim, Cedar Park, TX (US); Yun-Tsan Lee, East District (TW); Ching Wei Chang, Cedar Park, TX (US); Sumana Pallampati, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 239 days.

(21) Appl. No.: 18/496,869

(22) Filed: Oct. 28, 2023

(65) Prior Publication Data

US 2025/0142714 A1 May 1, 2025

(51) Int. Cl.
| | |
|---|---|
| *H05K 1/02* | (2006.01) |
| *H01Q 1/22* | (2006.01) |
| *H05K 1/11* | (2006.01) |
| *H05K 3/303* | (2026.01) |

(52) U.S. Cl.
CPC .............. *H05K 1/0243* (2013.01); *H01Q 1/22* (2013.01); *H05K 1/111* (2013.01); *H05K 3/303* (2013.01); *H05K 1/0277* (2013.01); *H05K 2201/10015* (2013.01); *H05K 2201/10022* (2013.01); *H05K 2201/1003* (2013.01); *H05K 2201/10098* (2013.01)

(58) Field of Classification Search
CPC ...... H05K 1/0243; H05K 1/111; H05K 3/303; H05K 1/0277; H05K 2201/10015; H05K 2201/10022; H05K 2201/1003; H05K 2201/10098; H01Q 1/22; H01Q 1/241; H01Q 1/38; H01Q 5/335
See application file for complete search history.

(56) References Cited

U.S. PATENT DOCUMENTS

| | | | |
|---|---|---|---|
| 10,771,096 B2 | 9/2020 | Domino | |
| 11,588,512 B2 | 2/2023 | Farahvash et al. | |
| 2017/0149140 A1* | 5/2017 | Jansson | ........... H01Q 5/335 |
| 2020/0287272 A1* | 9/2020 | Yang | ........... H04M 1/026 |

FOREIGN PATENT DOCUMENTS

| | | | | |
|---|---|---|---|---|
| CN | 110198175 A | * | 9/2019 | .......... H01Q 5/28 |
| EP | 4199251 A1 | * | 6/2023 | .......... H01Q 5/335 |

OTHER PUBLICATIONS

Translation of CN-110198175-A (Year: 2019).*

* cited by examiner

*Primary Examiner* — Renan Luque
(74) *Attorney, Agent, or Firm* — Larson Newman, LLP

(57) ABSTRACT

A printed circuit board includes an antenna and a plurality of component pads. The printed circuit board is configured to provide an antenna tuner for a mobile data communication network. Each component pad is configured, when populated with an electrical component, to couple the electrical component to the printed circuit board to form an antenna tuner circuit for the antenna. When a first set of the component pads are populated with electrical components, the antenna tuner circuit is configured as an aperture tuner for the antenna. When a second set of the component pads are populated with electrical components, the antenna tuner circuit is configured as an impedance tuner for the antenna.

14 Claims, 10 Drawing Sheets

*(Common PCB)*

*(Prior Art Aperture Tuner)*

*(Prior Art Impedance Tuner)*

*(Common PCB)*

200/300

*(Aperture Tuning PCB-1)*

400

*(Aperture Tuning Schematic-1)*

*(Aperture Tuning PCB-2)*

600

(Aperture Tuning Schematic-2)

*(Impedance Tuning PCB)*

800

*(Impedance Tuning Schematic)*

900

*(Rigid Printed Circuit Board)*

950

*(Flexible Printed Circuit Board)*

MULTI-CONFIGURABLE ANTENNA TUNER CIRCUIT BOARD

FIELD OF THE DISCLOSURE

This disclosure generally relates to information handling systems, and more particularly relates to a multi-configurable antenna tuner circuit board for an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include an antenna and a plurality of component pads. The printed circuit board may be configured to provide an antenna tuner for a mobile data communication network. Each component pad may be configured, when populated with an electrical component, to couple the electrical component to the printed circuit board to form an antenna tuner circuit for the antenna. When a first set of the component pads are populated with electrical components, the antenna tuner circuit may be configured as an aperture tuner for the antenna. When a second set of the component pads are populated with electrical components, the antenna tuner circuit may be configured as an impedance tuner for the antenna.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Information handling systems, from mobile devices and laptop systems to desktop computers and workstations, increasingly include mobile data communication network sub-systems to provide connectivity to the Internet or other network-based resources. The mobile data communications networks may include WiFi networks, cellular communication networks such as 4G/5G wireless networks or the like. In implementing the mobile data communication network sub-systems on information handling systems, antenna tuning is an important aspect of maintaining reliable data communications to cover the increasing broadband spectrum and to overcome design limitations and the narrow bandwidth of the typical antenna design and the constraints imposed by the small form factors of the information handling systems.

Figure 1A:
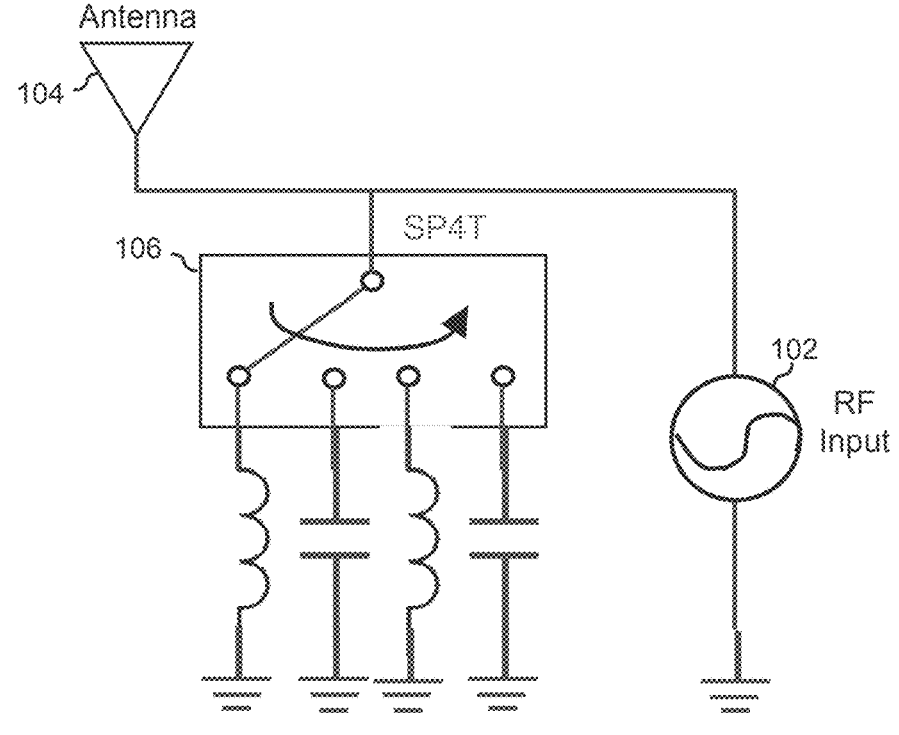
FIG. 1A is a schematic diagram of an aperture tuner for an antenna in an information handling system according to the prior art.

FIG. 1A illustrates an aperture tuner 100 for an antenna in an information handling system, as may be known in the prior art. Aperture tuner 100 includes a RF signal input 102 connected to an antenna 102, and an aperture tuning network 106. Aperture tuning network 106 provides selectable tuning impedances connected in shunt with RF signal input 102. Aperture tuner 100 generally provides varied shunting methods to alter the electrical length of the antenna design thereby changing its characteristics, or, as used in a para-sitic-path environments, to couple a parasitic arm of the antenna to a main radiator providing additional coupled capacitance. The details of aperture tuning of a mobile data communication network sub-system are known in the art and will not be further described herein, except as may be needed to illustrate the current embodiments.

Figure 1B:
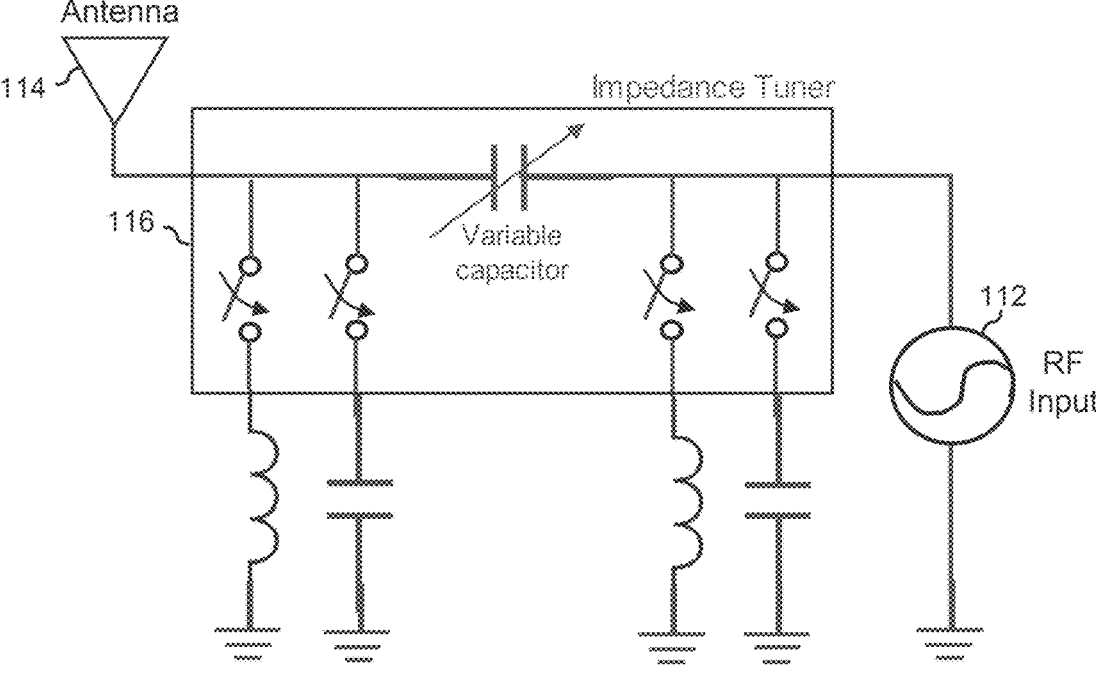
FIG. 1B is a schematic diagram of an impedance tuner for an antenna in an information handling system according to the prior art.

FIG. 1B illustrates an impedance tuner 110 for an antenna in an information handling system, as may be known in the prior art. Impedance tuner 110 includes a RF signal input 112, an antenna 112, and an impedance tuning network 116. Aperture tuning network 116 provides selectable tuning impedances connected in shunt with RF signal input 112, and a variable capacitor in series with antenna the RF input signal and antenna 116. Impedance tuner 110 typically provides variable capacitance in both series and shunt as well as providing a number of shunt switch paths such as those used in impedance tuners such as impedance tuner 100. This design is typically used for impedance matching to enhance the bandwidth and to better match the antenna design to the RF input port of the mobile data communica-tion network sub-system. The details of impedance tuning of a mobile data communication network sub-system are known in the art and will not be further described herein, except as may be needed to illustrate the current embodi-ments. As used in the prior art, a designer of a mobile data communication network sub-system in an information han-dling system has a design choice to make between imple-menting an aperture tuner such as aperture tuner 100 and an impedance tuner such as impedance tuner 110. Moreover in a family of information handling systems, the choice to use different types of tuners (that is, aperture tuners versus impedance tuners) leads to increased incremental cost bur-dens, SKU and inventory management, and design com-plexity.

Figure 2:
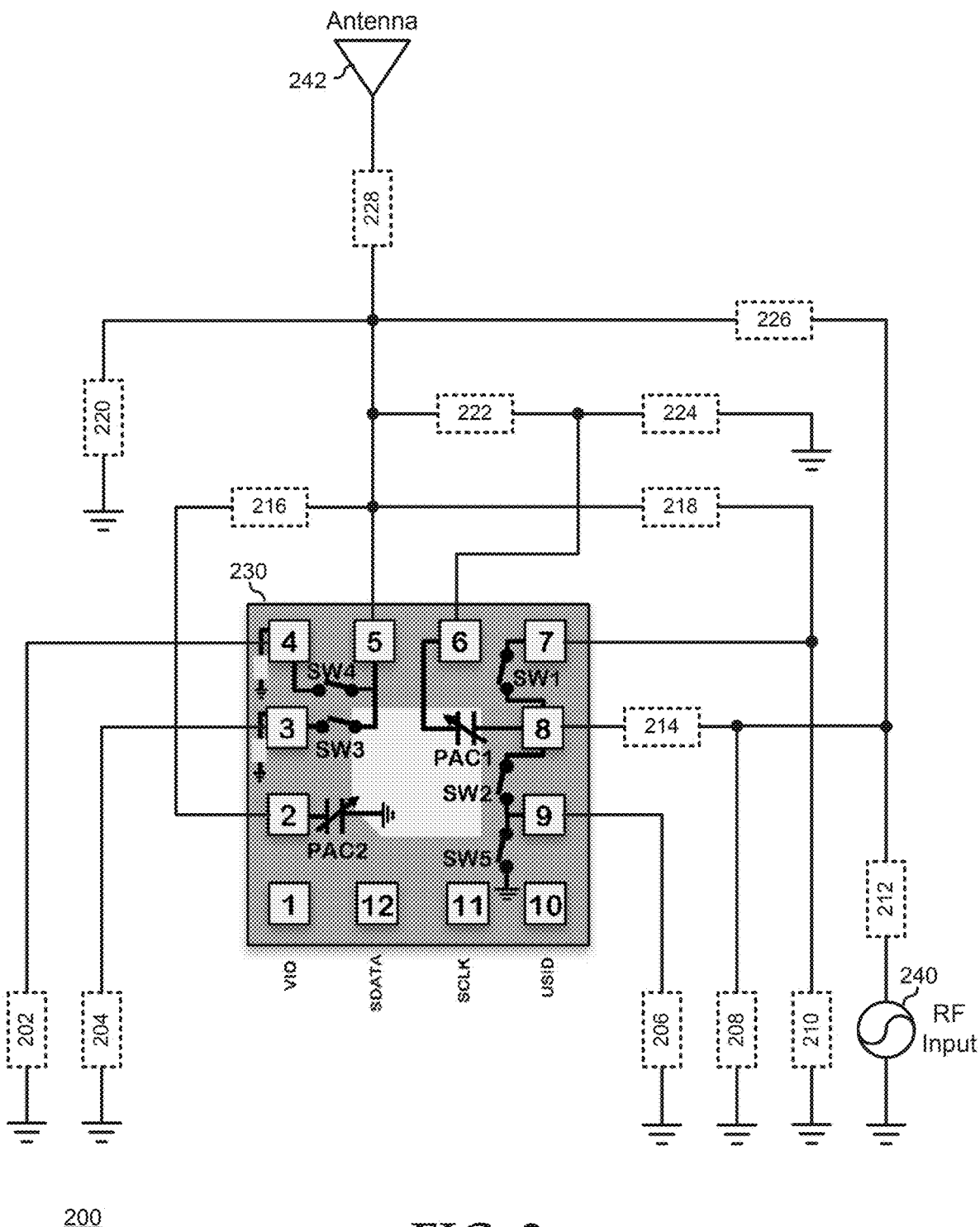
FIG. 2 illustrates a printed circuit board for a multi-configurable antenna tuner for an information handling system according to an embodiment of the current disclosure.

FIG. 2 illustrates a printed circuit board (PCB) 200 that provides for a multi-configurable antenna tuner for an infor-mation handling system. PCB 200 includes 14 component pads 202, 204, 206, 208, 210, 212, 214, 216, 218, 220, 222, 224, 226, and 228 (together referred to as component pads 202-228, or sub-groups accordingly), a tuner integrated circuit (IC) 230, an RF signal input 240, and an antenna 242. Component pads 202-228 represent features on a surface of PCB 200 that permit the installation of discreet components to be soldered to the PCB, as described further below. As such, component pads 202-228 are each associated with circuit traces that server to connect the installed components to other elements of the PCB to provide the functionality of the PCB as described further below. Component pads 202-228 can be selectively populated with discrete components such as resistors of various resistance values, capacitors of various capacitance values, or inductors of various induc-tance values, as needed or desired. Generally, component pads 202-228 may be understood to provide exposed metal on the surface of PCB 200, and the components installed may be understood to be complimentary types of compo-nents. For example, where component pads 202-228 repre-sent plated through-holes in PCB 200, the components will be through-hole mounted components, and where the com-ponent pads represent surface mount pads on the surface of the PCB, the components will be surface mount compo-nents. As illustrated, PCB 200 is unpopulated with any components, as illustrated by the dashed lines outlining component pads 202-228.

Tuner IC 230 represents an IC that is configured to provide programmably variable configurations that permit the tuner IC to alter the circuit paths provided to the components connected thereto. An example of tuner IC 230 may include a QM13031 Antenna Tuner Element by Qorvo, or another type of tuner integrated circuit. It will be noted that the specific implementation of PCB 200 as illustrated utilizing tuner IC 130 may be considered to be exemplary, and the specific implementation of the current embodiments my vary based upon the specific details of the tuner IC chosen for the application. As such, the description of the specific circuit details as described below should be under-stood to not be limiting on the embodiments as described herein. Tuner IC 230 includes 12 contacts, numbered 1-12, that are available to be connected to the components of PCB 200 as described herein. Contacts 1, 10, 11, and 12 provide an interface for control of tuner IC 130, as described below. Contact 2 is connected to an internal variable capacitor (PAC2) to a ground plane of tuner IC 230. Contact 3 is connected by an internal switch (SW3) to contact 5, and contact 5 is connected by an internal switch (SW4) to contact 5. Contact 6 is connected by an internal variable capacitor (PAC1) to contact 8. Contact 7 is connected by an internal switch (SW1) to contact 8, and contact 9 is con-nected by an internal switch (SW2) to contact 8. Contact 9 is also connected by an internal switch (SW5) to the internal ground.

Tuner IC 230 may provide low insertion loss and be capable of handling high RF voltages (for example 45Vp) on circuit contacts 2-9. The first variable capacitor (PAC1) may provide a wide tuning range of between 0.3 picofarads (pF) and 8.0 pF in step sizes of 0.24 pF, based upon control inputs from contacts 1, 10, 11, and 12. The second variable capacitor (PAC2) may provide a wide tuning range of between 0.3 pF and 4.0 pF in step sizes of 0.24 pF, based upon control inputs from contacts 1, 10, 11, and 12. The switches (SW1, SW2, SW3, SW4, and SW5) are individu-ally controllable based upon control inputs from contacts 1, 10, 11, and 12. The control inputs (contacts 1, 10, 11, and 12) may be based on a Mobile Industry Processor Interface (MIPI), a RF Front End (RFFE) Control Interface, or the like.

A first terminal of component pad 202 is connected to a ground plane of PCB 200, and a second terminal of the component pad is connected to contact 4. A first terminal of component pad 204 is connected to the ground plane, and a second terminal of the component pad is connected to contact 3. A first terminal of component pad 206 is con-nected to the ground plane, and a second terminal of the component pad is connected to contact 9. A first terminal of component pad 208 is connected to the ground plane, and a second terminal of the component pad is connected to a first terminal of component pad 212, a first terminal of compo-nent pad 214, and to a first terminal of component pad 226. A first terminal of component pad 210 is connected to the ground plane, and a second terminal of the component pad is connected to a first terminal of component pad 218. A second terminal of component pad 212 is connected to RF signal input 240. A second terminal of component 214 is connected to contact 8.

A first terminal of component pad 216 is connected to contact 2, and a second terminal of the component pad is connected to contact 5, to a second terminal of component pad 218, to a first terminal of component pad 220, to a first terminal of component pad 222, to a second terminal of component pad 226, and to a first terminal of component pad 228. A second terminal of component pad 220 is connected to the ground plane. A second terminal of component pad 222 is connected to contact 6 and to a first terminal of component pad 224. A second terminal of component pad

224 is connected to the ground plane. A second terminal of component pad 228 is connected to antenna 242. By selectively populating component pads 202-228, controlling switches 1-4 (SW1, SW2, SW3, SW4, and SW5), and controlling variable capacitors (PAC1 and PAC2), PCB 200 can be configured to provide an aperture tuner for antenna 242 in a first configuration, as illustrated in FIGS. 3 and 4, below, to provide an aperture tuner for the antenna in a second configuration, as illustrated in FIGS. 5 and 6, below, or to provide an impedance tuner for the antenna, as illustrated in FIGS. 7 and 8, below.

Figure 3:
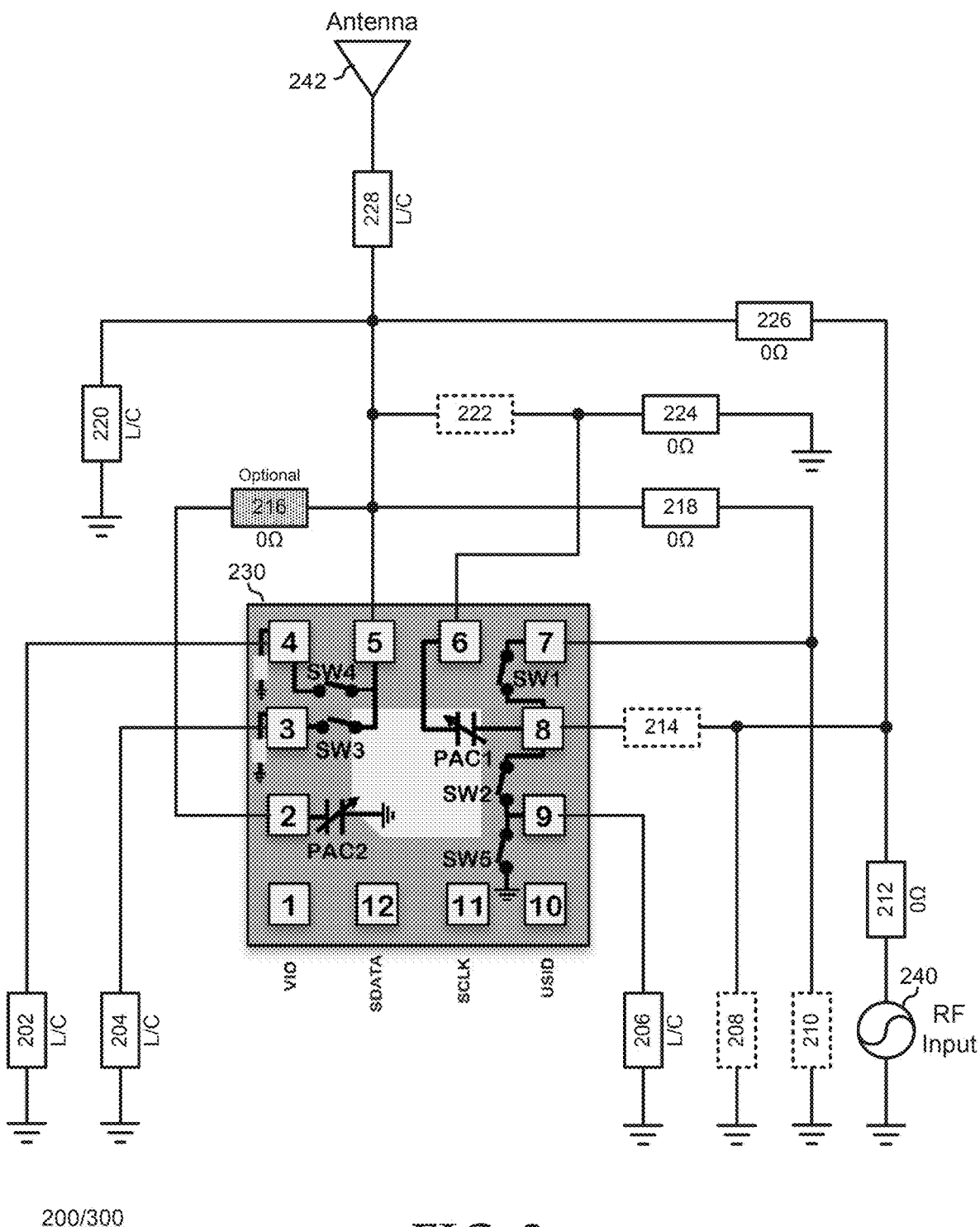
FIG. 3 illustrates the printed circuit board of FIG. 2, configured as an aperture tuner.
Figure 4:
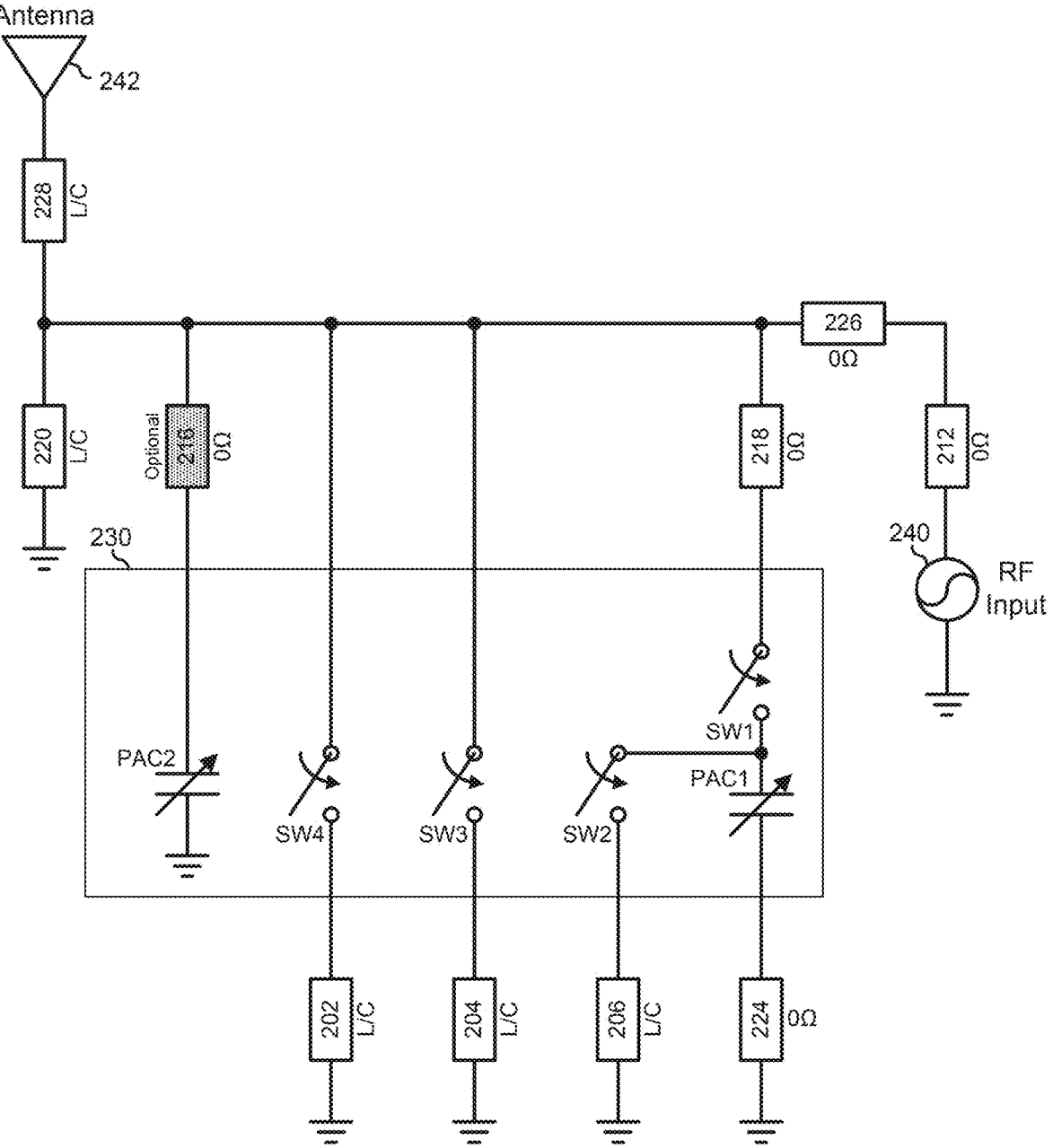
FIG. 4 is a schematic diagram of the aperture tuner of FIG. 2.

FIG. 3 illustrates a PCB 300 where PCB 200 is selectively populated with components to provide aperture tuning in a first configuration for antenna 242. Unpopulated component pads are illustrated by the dashed lines outlining the component pads, populated component pads are illustrated by the solid lines outlining the component pads, while optionally populated pads are illustrated by the solid lines outlining the component pads and such pads are also darkened. Thus component pads 208, 210, 214, and 222 are unpopulated with any components. RF signal input 240 is connected to antenna 242 by populating component pads 212 and 226 with zero ohm (0Ω) conductors. Antenna 242 is impedance matched to a desired impedance by populating conductor pads 220 and 228 with inductors or capacitors (L/C) as needed to provide the impedance matching. Three (3) selectable aperture tuning elements are provided through three switches (SW4, SW3, and SW2) by populating component pads 202, 204, and 206 respectively with inductors or capacitors (L/C) as needed or desired, and a fourth selectable aperture tuning element is provided as the first variable capacitor (PAC1) by populating component pads 218 and 224 with zero ohm (0Ω) conductors. Finally, the impedance match for antenna 242 can optionally be provided with finer grained matching than is provided by the components populating component pads 220 and 228. Component pad 216 can be populated with a zero ohm (0Ω) conductor and the second variable capacitor (PAC2) can be adjusted to provide the finer grained antenna matching. FIG. 4 illustrates a schematic 400 of PCB 300.

Figure 5:
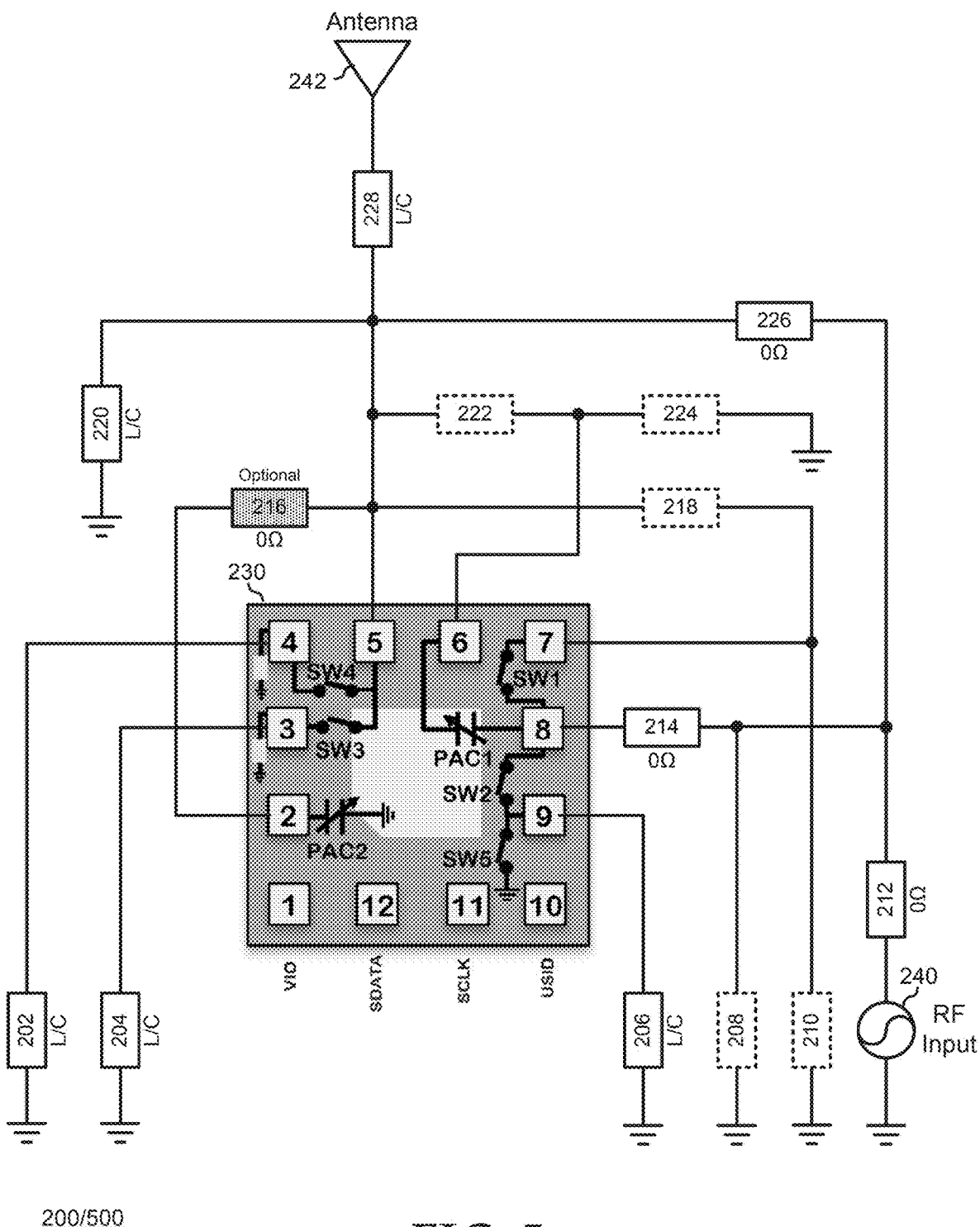
FIG. 5 illustrates the printed circuit board of FIG. 2, configured as another aperture tuner.
Figure 6:
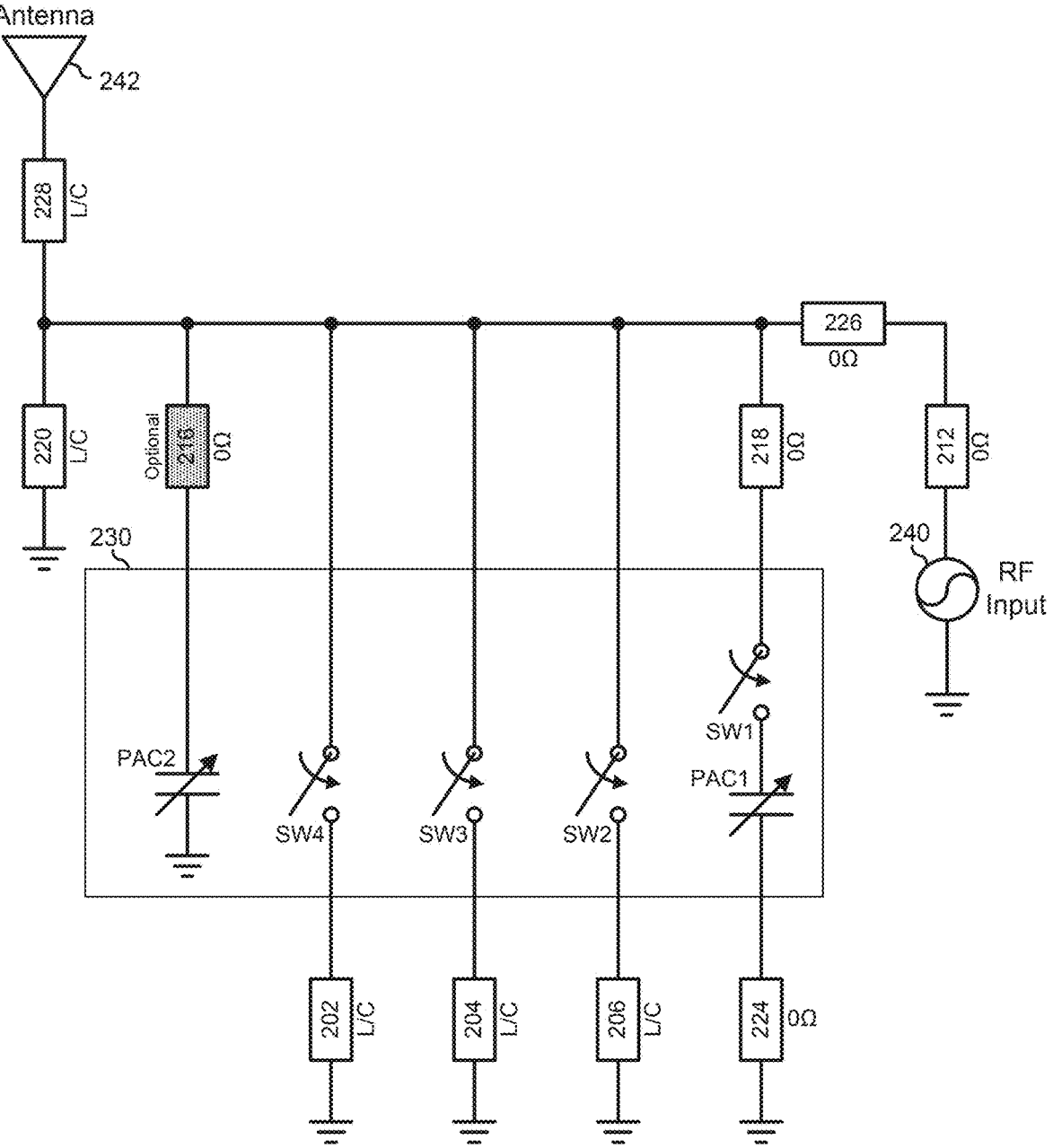
FIG. 6 is a schematic diagram of another aperture tuner of FIG. 2.

FIG. 5 illustrates a PCB 500 where PCB 200 is selectively populated with components to provide aperture tuning in a second configuration for antenna 242. As noted above, unpopulated component pads are illustrated by the dashed lines outlining the component pads, populated component pads are illustrated by the solid lines outlining the component pads, while optionally populated pads are illustrated by the solid lines outlining the component pads and such pads are also darkened. Thus component pads 208, 210, 218, 222, and 224 are unpopulated with any components. RF signal input 240 is connected to antenna 242 by populating component pads 212 and 226 with zero ohm (0Ω) conductors. Antenna 242 is impedance matched to a desired impedance by populating conductor pads 220 and 228 with inductors or capacitors (L/C) as needed to provide the impedance matching. Two (2) selectable aperture tuning elements are provided through three switches (SW4 and SW3) by populating component pads 202 and 204 respectively with inductors or capacitors (L/C) as needed or desired, a third selectable aperture tuning element is provided through a single switch (SW2) by populating component pad 206 with an inductor or capacitor (L/C) as needed or desired and populating component pad 214 with a zero ohm (0Ω) conductor, and a fourth selectable aperture tuning element is provided as the first variable capacitor (PAC1) by populating component pads 218 and 224 with zero ohm (0Ω) conductors. Finally, the impedance match for antenna 242 can optionally be provided with finer grained matching than is provided by the components populating component pads 220 and 228. Component pad 216 can be populated with a zero ohm (0Ω) conductor and the second variable capacitor (PAC2) can be adjusted to provide the finer grained antenna matching. FIG. 6 illustrates a schematic 600 of PCB 500.

Figure 7:
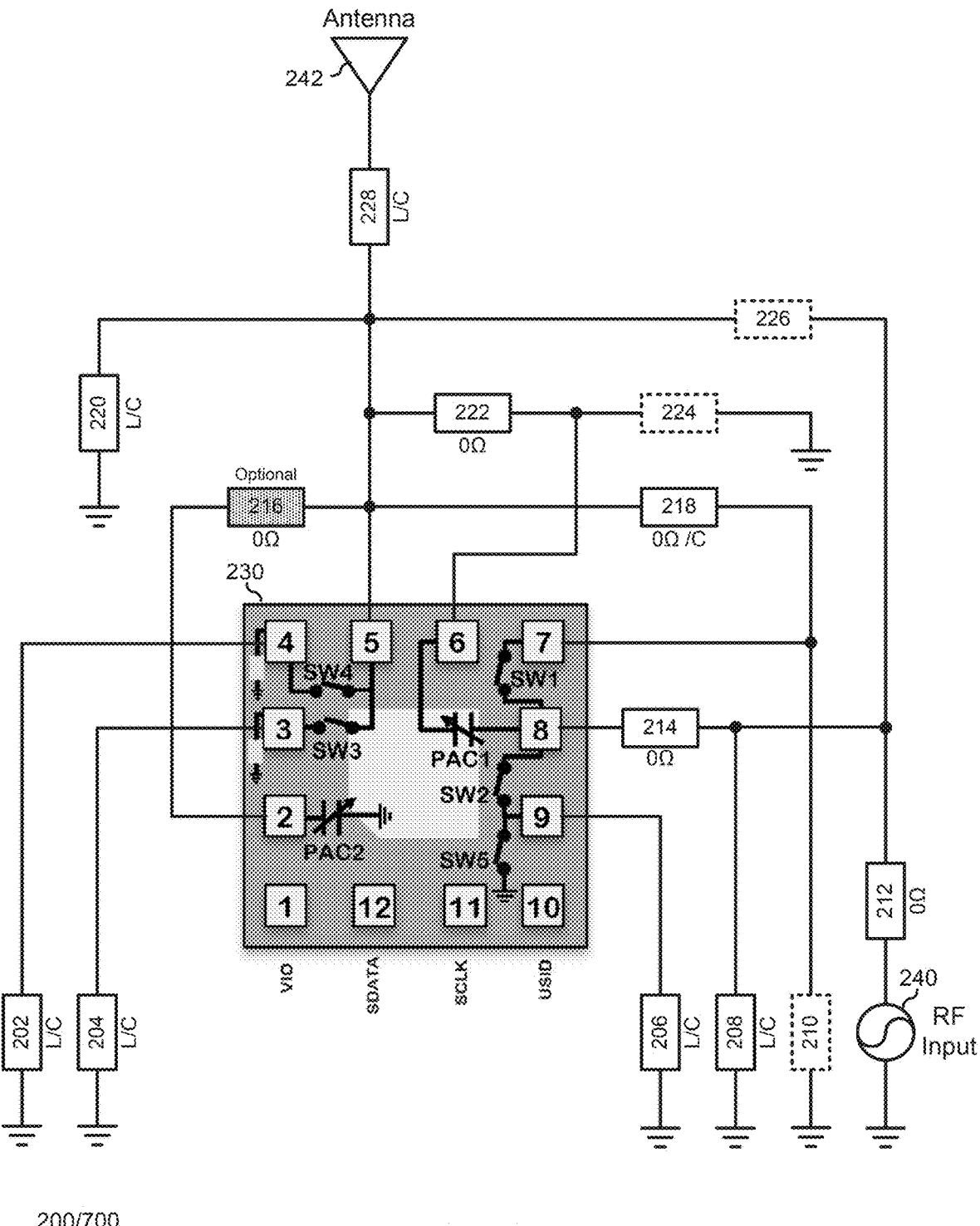
FIG. 7 illustrates the printed circuit board of FIG. 2, configured as an impedance tuner.
Figure 8:
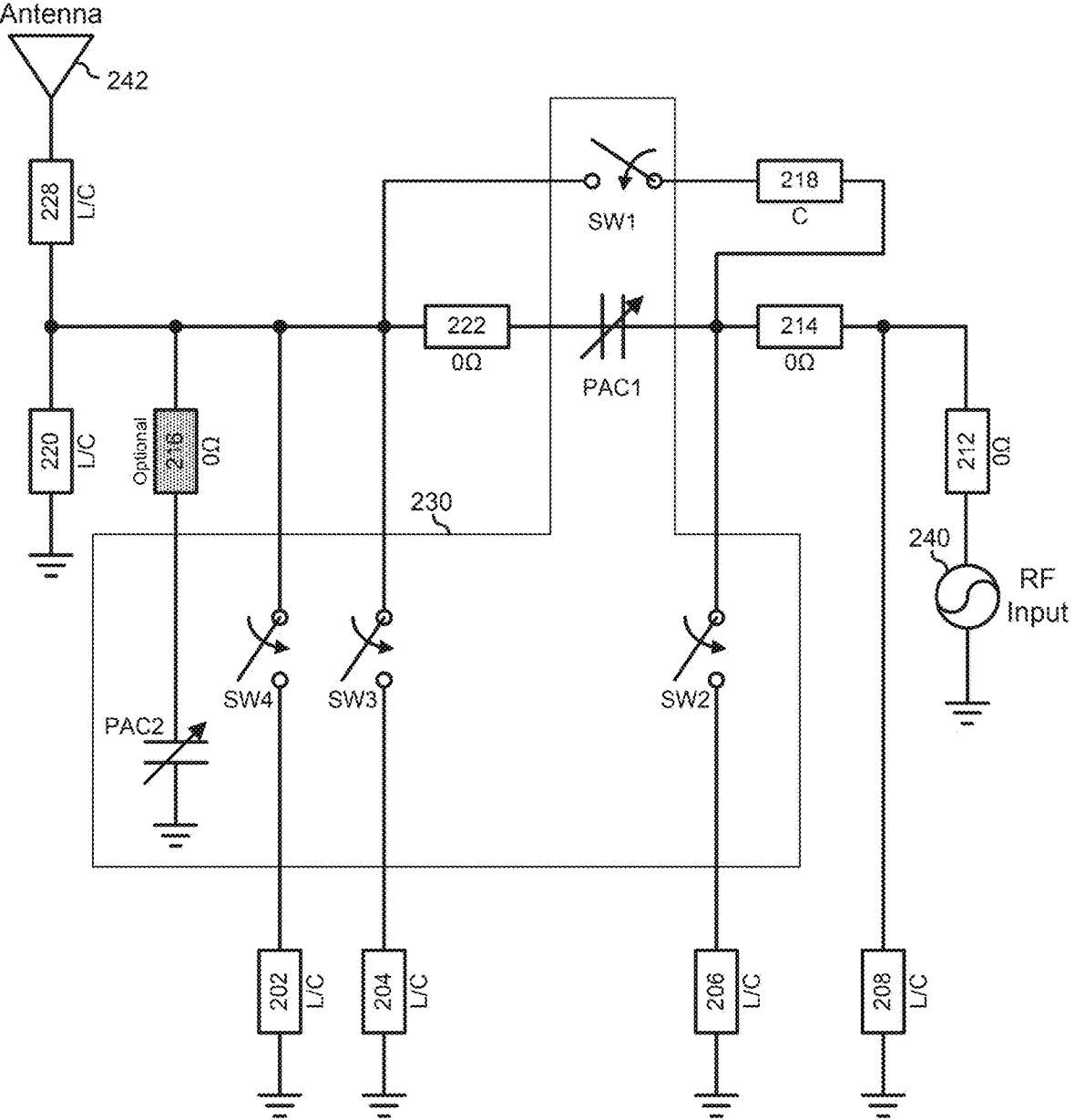
FIG. 8 is a schematic diagram of the aperture tuner of FIG. 7.

FIG. 7 illustrates a PCB 700 where PCB 200 is selectively populated with components to provide impedance tuning for antenna 242. Again, unpopulated component pads are illustrated by the dashed lines outlining the component pads, populated component pads are illustrated by the solid lines outlining the component pads, and optionally populated pads are illustrated by the solid lines outlining the component pads and such pads are also darkened. Component pads 210, 224, and 226 are unpopulated with any components. RF signal input 240 is connected to the first variable capacitor (PAC1) by populating component pads 212 and 226 with zero ohm (0Ω) conductors. The first variable capacitor (PAC1) is provided with additional parallel capacitance (C) by populating component pad 218 with a capacitor (C) with a capacitance as needed or desired. The first variable capacitor (CPA1) and the additional parallel capacitance (C) is connected to antenna 242 by populating component pads 222 with a zero ohm (0Ω) conductor.

Antenna 242 is impedance matched to a desired impedance by populating conductor pads 220 and 228 with inductors or capacitors (L/C) as needed to provide the impedance matching. Three (3) selectable impedance tuning elements are provided through three switches (SW4, SW3, and SW2) by populating component pads 202, 204, and 206 respectively with inductors or capacitors (L/C) as needed or desired, and a fourth fixed impedance tuning element is provided by populating component pad 208 with an inductor or capacitor (L/C) as needed to provide the impedance matching. Finally, the impedance match for antenna 242 can optionally be provided with finer grained matching than is provided by the components populating component pads 220 and 228. Component pad 216 can be populated with a zero ohm (0Ω) conductor and the second variable capacitor (PAC2) can be adjusted to provide the finer grained antenna matching. FIG. 8 illustrates a schematic 800 of PCB 700.

In either the aperture tuning case or the impedance tuning case, the configurations of PCBs 300, 500, and 700 can be readily modified to accommodate parasitic coupled radiator configurations by isolating RF signal input 240, for example by depopulating component pad 212, as needed or desired. PCBs 200, 300, 500, and 700 may include additional components (not illustrated) that provide additional functionality to the PCBs. For example, PCBs 200, 300, and 500 may include components associated with the control inputs to tuning IC 230 (contacts 1, 10, 11, and 12), with proximity sensors for parasitic coupled radiator configurations, RF decoupling, and the like, components for connecting the PCBs to other components of the information handling system, such as multi-pin connectors, coaxial cables, and the like.

Figure 9A:
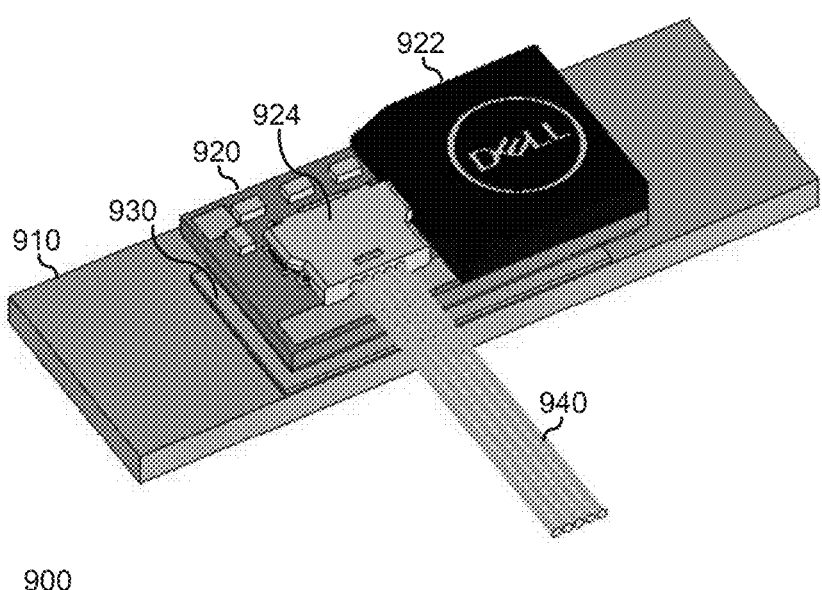
FIG. 9A illustrates a portion of an information handling system including a printed circuit board instantiating a multi-configurable antenna tuner according to an embodiment of the current disclosure.

FIG. 9A illustrates a portion of an information handling system 900 including a housing 910, a PCB 920 instantiating a multi-configurable antenna tuner, an antenna 930 coupled to the PCB, and a ribbon cable 940 to connect the PCB to other components of the information handling system. PCB 920 includes a tuning IC 922, and a connector 224 connected to ribbon cable 940. PCB 920 is fabricated utilizing a rigid circuit board material. As such, PCB 920 generally has a compact footprint, but is fabricated utilizing multiple circuit layers and hence is relatively thick. The thickness of PCB 920 generally provides a limitation as to the placement of the PCB within information handling system 900, and careful design consideration is given to the construction and placement of the PCB.

Figure 9B:
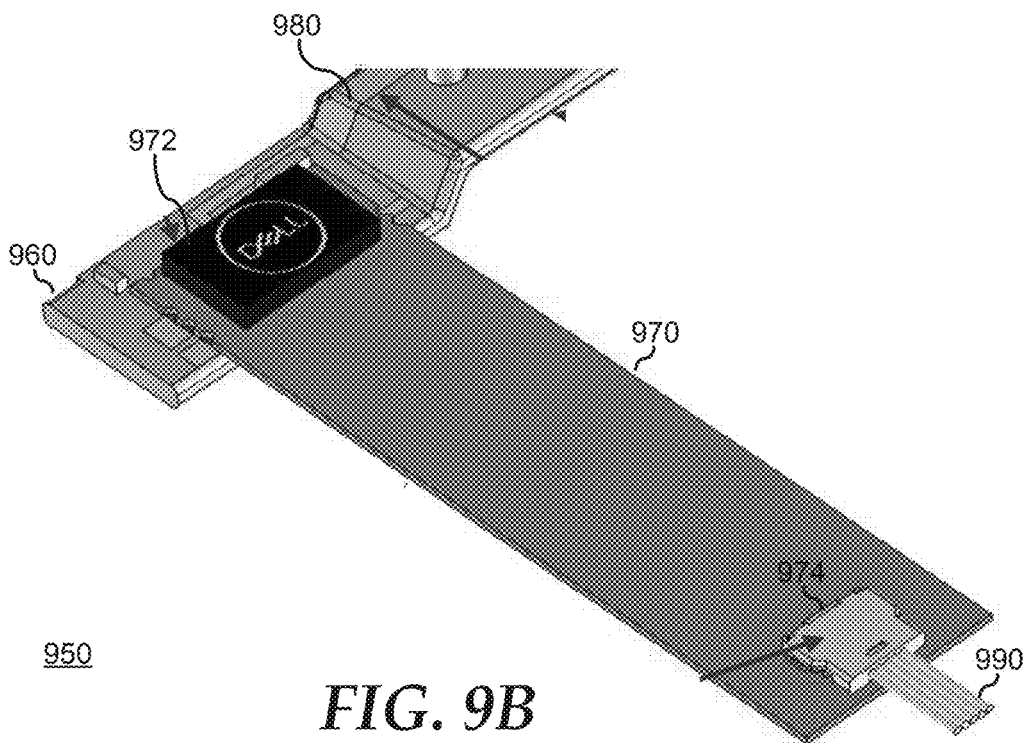
FIG. 9B illustrates a portion of an information handling system including a printed circuit board instantiating a multi-configurable antenna tuner according to another embodiment of the current disclosure.

FIG. 9B illustrates a portion of an information handling system 950 including a housing 960, a PCB 970 instantiating a multi-configurable antenna tuner, an antenna 980 coupled to the PCB, and a ribbon cable 990 to connect the PCB to other components of the information handling system. PCB 970 includes a tuning IC 972, and a connector 274 connected to ribbon cable 990. PCB 970 is fabricated utilizing a flexible circuit board material. As such, PCB 970 generally has a larger footprint than PCB 920, but is fabricated utilizing fewer circuit layers than PCB 920. Hence PCB 970 is thinner than PCB 920, providing greater flexibility as to the placement of the PCB within information handling system 950.

Figure 10:
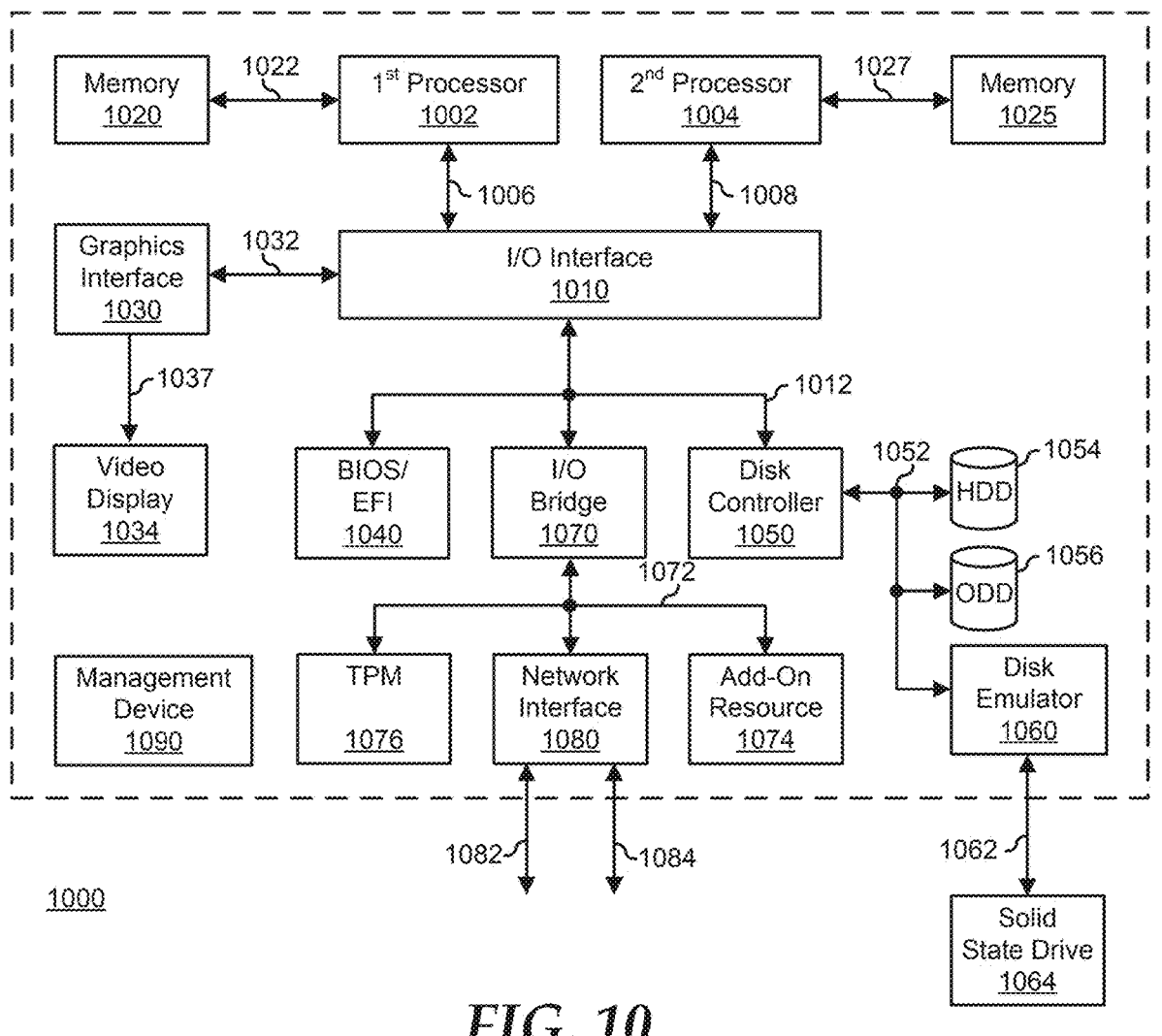
FIG. 10 is a block diagram illustrating a generalized information handling system according to another embodiment of the present disclosure.

FIG. 10 illustrates a generalized embodiment of an information handling system 1000. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components.

Information handling system 1000 can include devices or modules that embody one or more of the devices or modules described below, and operates to perform one or more of the methods described below. Information handling system 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1064, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1064, I/O bridge 1070, add-on resources 1074, TPM 1076, and network interface 1080 operate together to provide a host environment of information handling system 1000 that operates to provide the data processing function-ality of the information handling system. The host environment operates to execute machine-executable code, including platform BIOS/UEFI code, device firmware, operating system code, applications, programs, and the like, to perform the data processing tasks associated with information handling system 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via a memory interface 1027. Graphics interface 1030 is connected to I/O interface 1010 via a graphics interface 1032, and provides a video display output 1036 to a video display 1034. In a particular embodiment, information handling system 1000 includes separate memories that are dedicated to each of processors 1002 and 1004 via separate memory interfaces. An example of memories 1020 and 1025 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1010 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 1040 includes BIOS/UEFI code operable to detect resources within information handling system 1000, to provide drivers for the resources, initialize the resources, and access the resources. BIOS/UEFI module 1040 includes code that operates to detect resources within information handling system 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to information handling system 1000 via an external interface 1062. An example of external interface 1062 includes a USB interface, an IEEE 10394 (Firewire) interface, a proprietary interface, or a combination thereof. Alternatively, solid-state drive 1064 can be disposed within information handling system 1000.

I/O bridge 1070 includes a peripheral interface 1072 that connects the I/O bridge to add-on resource 1074, to TPM 1076, and to network interface 1080. Peripheral interface 1072 can be the same type of interface as I/O channel 1012, or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type.

Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as I/O interface 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1000, such as system cooling fans and power supplies. Management device 1090 can include a network connection to an external management system, and the management device can communicate with the management system to report status information for information handling system 1000, to receive BIOS/UEFI or system firmware updates, or to perform other task for managing and controlling the operation of information handling system 1000. Management device 1090 can operate off of a separate power plane from the components of the host environment so that the management device receives power to manage information handling system 1000 when the information handling system is otherwise shut down. An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1090 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board for providing an antenna tuner for a mobile data communication network, the printed circuit board comprising:
   an antenna;
   a plurality of component pads, wherein each component pad is configured, when populated with an electrical component, to couple the electrical component to the printed circuit board to form an antenna tuner circuit for the antenna;
   a first variable capacitor; and
   a second variable capacitor;
   wherein, when a first set of the component pads are populated with electrical components, the antenna tuner circuit is configured as an aperture tuner for the antenna, and when a second set of the component pads are populated with electrical components, the antenna tuner circuit is configured as an impedance tuner for the antenna, and wherein, when a first component pad of the plurality of component pads is populated with a first electrical component, the second variable capacitor is coupled in shunt between a radio frequency signal input and the antenna.

2. The printed circuit board of claim 1 wherein, when the first set of component pads are populated, the first variable capacitor is coupled in shunt between a radio frequency signal input and the antenna.

3. The printed circuit board of claim 1 wherein, when the second set of component pads are populated, the first variable capacitor is coupled in series between a radio frequency signal input and the antenna.

4. The printed circuit board of claim 1, wherein the printed circuit board is a rigid printed circuit board.

5. The printed circuit board of claim 1, wherein the printed circuit board is a flexible printed circuit board.

6. The printed circuit board of claim 1, wherein the antenna is a parasitic coupled radiator.

7. The printed circuit board of claim 1, wherein the electrical components include at least one of a resistor, a capacitor, and an inductor.

8. A method for providing an antenna tuner for a mobile data communication network, the method comprising:

coupling an antenna to a printed circuit board;

providing, on the printed circuit board, a plurality of component pads, wherein each component pad is configured, when populated with an electrical component, to couple the electrical component to the printed circuit board to form an antenna tuner circuit for the antenna;

providing, on the printed circuit board, a first variable capacitor and a second variable capacitor;

determining whether to configure the printed circuit board to implement an aperture tuner or an impedance tuner;

when the printed circuit board is determined to implement the aperture tuner, populating a first set of the component pads with electrical components; and when the printed circuit board is determined to implement the impedance tuner, populating a second set of the component pads with electrical components;

wherein, when a first component pad of the plurality of component pads is populated with a first electrical component, the second variable capacitor is coupled in shunt between a radio frequency signal input and the antenna.

9. The method of claim 8 wherein, when the first set of component pads are populated, the method further comprises coupling the first variable capacitor in shunt between a radio frequency signal input and the antenna.

10. The method of claim 8 wherein, when the second set of component pads are populated, the method further comprises coupling the first variable capacitor in series between a radio frequency signal input and the antenna.

11. The method of claim 8, wherein the printed circuit board is a rigid printed circuit board.

12. The method of claim 8, wherein the printed circuit board is a flexible printed circuit board.

13. The method of claim 8, wherein the antenna is a parasitic coupled radiator.

14. An information handling system, comprising:

an antenna for a mobile data communication network;

a printed circuit board for providing an antenna tuner for the antenna, the printed circuit board including a plurality of component pads, wherein each component pad is configured, when populated with an electrical component, to couple the electrical component to the printed circuit board to form an antenna tuner circuit for the antenna;

a first variable capacitor; and a second variable capacitor;

wherein when a first set of the component pads are populated with electrical components, the antenna tuner circuit is configured as an aperture tuner for the antenna, and when a second set of the component pads are populated with electrical components, the antenna tuner circuit is configured as an impedance tuner for the antenna, and wherein, when a first component pad of the plurality of component pads is populated with a first electrical component, the first variable capacitor is coupled in shunt between a radio frequency signal input and the antenna.

\* \* \* \* \*